United States Patent
Glaser et al.

(10) Patent No.: US 7,679,103 B2
(45) Date of Patent: Mar. 16, 2010

(54) INTEGRATED CIRCUIT ARRANGEMENT WITH SHOCKLEY DIODE OR THYRISTOR AND METHOD FOR PRODUCTION AND USE OF A THYRISTOR

(75) Inventors: Ulrich Glaser, Munich (DE); Harald Gossner, Riemerling (DE); Kai Esmark, Neurled (DE)

(73) Assignee: Infineon Technologies AG, Munich (DE)

( * ) Notice: Subject to any disclaimer, the term of this patent is extended or adjusted under 35 U.S.C. 154(b) by 505 days.

(21) Appl. No.: 11/604,519

(22) Filed: Nov. 27, 2006

(65) Prior Publication Data

US 2007/0158750 A1   Jul. 12, 2007

(30) Foreign Application Priority Data

Nov. 29, 2005   (DE) .................. 10 2005 056 908

(51) Int. Cl.
*H01L 29/744* (2006.01)
*H01L 29/74* (2006.01)

(52) U.S. Cl. .................. 257/109; 257/E27.052; 257/E27.079; 257/107

(58) Field of Classification Search ............. 257/109, 257/107, E27.052, E27.079
See application file for complete search history.

(56) References Cited

U.S. PATENT DOCUMENTS

| | | | |
|---|---|---|---|
| 6,465,848 B2 * | 10/2002 | Ker et al. | 257/355 |
| 2004/0080883 A1 | 4/2004 | Chatterjee et al. | |
| 2004/0240130 A1 | 12/2004 | Kitagawa | |

FOREIGN PATENT DOCUMENTS

EP   1 058 308 A1   12/2000

* cited by examiner

*Primary Examiner*—Marcos D. Pizarro
*Assistant Examiner*—Eva Y. Montalvo
(74) *Attorney, Agent, or Firm*—Brinks Hofer Gilson & Lione

(57) ABSTRACT

An integrated circuit arrangement includes a Shockley diode or a thyristor. An inner region of the diode or of the thyristor is completely or partially shielded during the implantation of a p-type well. This gives rise to a Shockley diode or a thyristor having improved electrical properties, in particular with regard to the use as an ESD protection element.

14 Claims, 3 Drawing Sheets

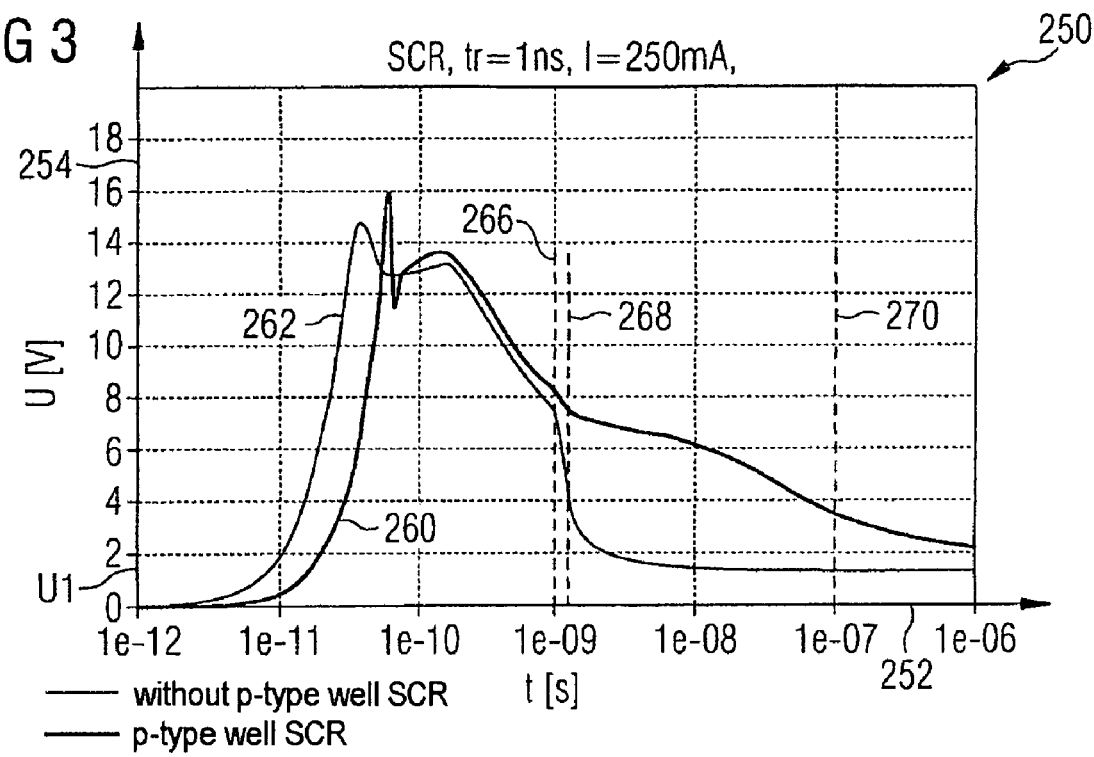
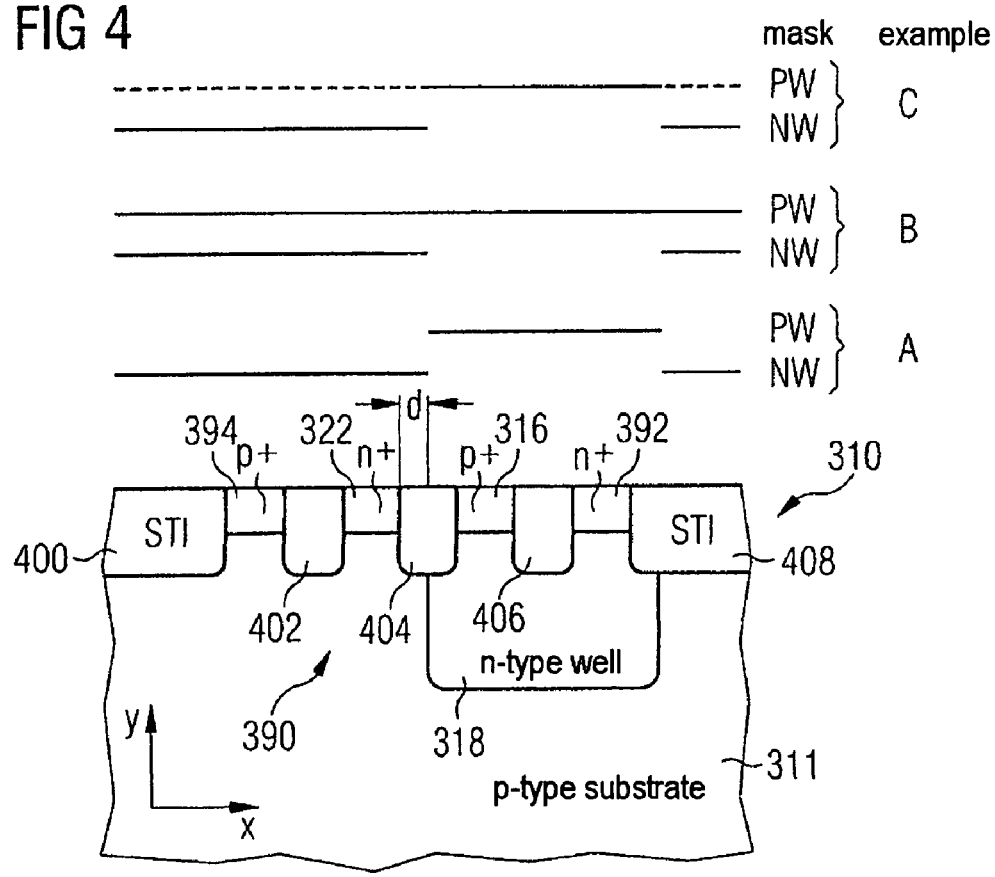

INTEGRATED CIRCUIT ARRANGEMENT WITH SHOCKLEY DIODE OR THYRISTOR AND METHOD FOR PRODUCTION AND USE OF A THYRISTOR

CROSS-REFERENCE TO RELATED APPLICATIONS

This application claims priority to German Patent Application DE 10 2005 056 908.0, filed Nov. 29, 2005, which is herein incorporated in its entirety by reference.

BACKGROUND

1. Field of the Invention

The invention relates to an integrated circuit arrangement containing a Shockley diode (four-region diode) or a thyristor.

2. Description of Related Art

Fundamentally different technological considerations apply to integrated components arranged in integrated circuit arrangements in comparison with individual components. Thus, in an integrated circuit arrangement, all the connections should be situated on one side of the substrate. This applies in particular to an anode connection contact-connected to the anode region and to a cathode connection contact-connected to the cathode region. If one inner region or both inner regions is or are likewise contact-connected, then a thyristor arises from the Shockley diode. In this case, too, connections which make contact with the inner region or the inner regions should be situated on the same area as the anode connection and the cathode connection.

The thyristor used in an integrated circuit arrangement often serves as an ESD protection element (electrostatic discharge), that is to say for protection against an overvoltage which exceeds the operating voltage for example by at least 10 percent or by at least 20 percent, or for protection against an overcurrent which exceeds the operating current by at least one order of magnitude. Without the ESD protection element, the integrated circuit arrangement would be destroyed in the ESD case, in particular by destruction of one of its transistors. However, construction of these integrated circuit arrangements are often complex, creating the need for a more simplified construction.

SUMMARY

It is an object of the invention to specify a simply constructed integrated circuit arrangement comprising a Shockley diode or thyristor, the Shockley diode or the thyristor having electrical properties which improve the use as an ESD protection element. Moreover, a production method is intended to be specified. Furthermore, a use of a thyristor is intended to be specified.

The integrated circuit arrangement includes a substrate having (a) an anode region doped in accordance with the p doping type in a typically monocrystalline substrate, (b) a cathode region spaced apart from the anode region and doped in accordance with the n doping type, (c) an n-type inner region doped in accordance with the n doping type and with a lower dopant concentration in comparison with the anode region, said inner region adjoining the anode region, and (d) a p-type inner region doped in accordance with the p doping type and with a lower dopant concentration in comparison with the cathode region, said inner region adjoining the cathode region and the n-type inner region.

In addition to the regions mentioned above, the integrated circuit arrangement according to the invention contains a p-type well typically arranged in the substrate and containing a maximum dopant concentration, in which case, along a path running counter to a direction of the normal to a preferably planar surface of the substrate and through or at the cathode region down to a depth at which the maximum dopant concentration of the p-type well is also situated, the maximum dopant concentration of the p-type inner region remains below the maximum p-type dopant concentration of the p-type well.

This is used particularly in the case of a p-type substrate. The consideration taken as a basis here is the type inner region could be implanted with the aid of the same implantation step as the p-type well present anyway for accommodating the active semiconductor components of the integrated circuit arrangement or for insulating these integrated semiconductor components. This would be appropriate because n-type wells and p-type wells are formed complementarily from a design engineering standpoint for the following reasons: (a) the mask data for one type of well can easily be automatically converted into the mask data of the other type of well, and (b) the insulation strength is provided in any case if p-MOS transistors (metal oxide semiconductor) and n-MOS transistors are arranged directly alongside one another.

However, the turn-on time of the Shockley diode or of the thyristor can be considerably shortened if the p-type inner region has a maximum dopant concentration lying below the maximum dopant concentration of the p-type well. Consequently, during the production of the doping of the p-type well, the p-type inner region must be shielded completely or at least with a plurality of interruptions.

In an alternative or cumulative variant, the integrated circuit arrangement contains, in addition to the regions mentioned in the introduction, an n-type well typically arranged in the substrate and containing a maximum n-type dopant concentration, in which case, in the variant, along a path running counter to the direction of the normal to the preferably planar main area of the substrate and through or at the anode region down to a depth at which the maximum dopant concentration of the n-type well is also situated, the maximum dopant concentration of the n-type inner region remains below the maximum n-type dopant concentration of the n-type well.

The variant is used particularly in the case of an n-type substrate. The considerations just mentioned likewise apply to the alternative.

In one development of the circuit arrangement according to the invention, the anode region, the cathode region, the n-type inner region and the p-type inner region are constituent parts of an ESD protection element of the integrated circuit arrangement. The following circuit possibilities exist, inter alia, in the case of such protection elements:

the anode region is situated on an operating potential line carrying positive operating potential. The cathode region is situated on an operating potential line carrying negative or ground operating potential.

The anode region is situated on an operating potential line carrying positive operating potential. The cathode region is situated at an input and/or output connection.

The anode region is situated at a signal input connection and/or signal output connection. The cathode region is situated on an operating potential line carrying negative or ground operating potential.

In one configuration, the signal input connection and/or signal output connection is connected to the Shockley diode or to the thyristor directly, apart from one or a plurality of additional protection elements, in particular without the interposition of such protection elements.

These developments are based on the consideration that modern ESD protection concepts provide ESD protection elements between I/O (input/output) pads and supply voltage lines or else between different supply voltage lines and the ground lines thereof. The properties sought for the ESD protection elements include, inter alia:

a) a low leakage current during normal operation of the circuit,
b) a fast turn-on behavior in an ESD event,
c) a high current conductivity in the on state,
d) a clamping voltage which lies slightly above the normal supply voltage in controlled fashion during an ESD event, and
e) a low resistance in the high-current range.

As can be seen from the following table:

| Component | Turn-on time [ns] | max. Current conductivity [mA/μm] |
|---|---|---|
| Diode (chain) | <= 1 | 40 to 80 |
| ggMOSFET | <= 1 | 7 to 10 |
| SCR | 1 to 20 | 40 to 80 |

Thyristors (SCR—silicon controlled rectifier) are preferred to the ggMOSFET (grounded gate Metal Oxide Semiconductor Field Effect Transistor) owing to their maximum current conductivity (point c). Furthermore, the clamping voltage of an SCR can be set in the desired range (point d) and it has a low resistance (point e) in the high-current range in comparison with a diode-based solution. Just with regard to the turn-on behavior (point b), a conventional thyristor has deficiencies in comparison with diodes or ggMOSFETs. However, the present development improves precisely this deficiency, that is to say that it affords optimization possibilities for the turn-on behavior of the SCR. As a result, the transient voltage drop across the thyristor is also effectively improved since the static clamping voltage is reached earlier.

In another development, the ESD protection circuit contains no active components which serve for controlling the ESD protection element. In particular, a diode or diode chain and a ggMOSFET are absent. This development is based on the consideration that in previous ESD protection concepts with thyristors, a further current path could be incorporated via fast protection elements (e.g. ggMOSFETs or diode chains). These concepts would thereby combine the advantages of the different components. In further-developed circuits, the additional protection elements could simultaneously be used as trigger elements for the thyristor. However, disadvantages of such concepts, which could also be referred to as ggSCR (grounded gate SCR) or DTSCR (Diode Triggered SCR), compared with the concept of the development that is proposed here are, on the one hand, the additional space requirement needed by the additional fast protection elements and, on the other hand, a capacitance at the pad which is increased by the additional fast protection elements, depending on the concept, which is unfavorable especially for RF products (radio frequency), that is to say for operating frequencies of greater than 100 kHz, greater than 1 MHz or greater than 10 MHz.

In another development, the abovementioned path is situated at a side of the cathode region which faces the anode region. In the variant, by contrast, the path is situated at a side of the anode region which faces the cathode region. The dopant concentration along said paths is particularly important since it determines the essential electrical properties of the electronic component.

In a next development, the distance between mutually facing sides of the anode region and of the cathode region is less than 3 micrometers or even less than 1 micrometer. This measure ensures that the turn-on time is reduced further. The lower limit for said distance is determined by a minimum distance at which a short circuit is avoided in the electrical component.

In another development, the maximum dopant concentration of the p-type inner region remains at least one power of ten or at least two powers of ten below the maximum p-type dopant concentration of the p-type well. However, suitable values are also more than two powers of ten. In the variant, the maximum dopant concentration of the n-type inner region remains at least one power of ten or at least two powers of ten below the maximum n-type dopant concentration in the n-type well.

In another development, the p-type inner region has, at the path at a reference depth, which is equal to the depth of the location having the maximum dopant concentration in the p-type well, a dopant concentration which is at least one power of ten or at least two powers of ten below the maximum p-type dopant concentration of the p-type well. In the variant, the n-type inner region has, at the path at a reference depth, which is equal to the depth of the location having the maximum dopant concentration in the n-type well from the main area, a dopant concentration which is at least one power of ten or at least two powers of ten below the maximum n-type dopant concentration of the p-type well. The location having the maximum dopant concentration in the p-type well and the n-type well, respectively, typically lies at a depth within the range of 0.5 micrometer to 1.5 micrometers, more precisely within the range of 0.7 micrometer to 1.2 micrometers. A typical value for the depth of said location is 1 micrometer, by way of example. Since the reference wells can also be produced with the aid of a plurality of implantation steps, the reference region within the well is defined by the depths specified. The deepest implantation region of the well, which at the same time is the region having the greatest dopant concentration, is typically used as the reference region.

In one development, a basic dopant concentration of the substrate is present at the reference depth, at which the maximum dopant concentration of the reference well is also situated. This means that the p-type inner region or, in the variant, the n-type inner region is not additionally doped any further in comparison with the substrate. In other embodiments, however, in these regions a doping is chosen which lies between the dopant concentration of the substrate and the maximum dopant concentration of the reference well, in order to have one degree of freedom more for the optimization of the electrical properties.

In another development, the p-type well contains at least two well dopings having mutually different maximum dopant concentrations. A local minimum can be found between the maximum dopant concentrations. A doping corresponding to the well doping having the smaller maximum dopant concentration is also situated along the path. This means that not all of the dopings of the reference well are shielded from the n-type inner region. The electrical properties of the component can be improved further by this measure. By way of example, there are reference wells, having two secondary maxima and one primary maximum or a global maximum. Whereas e.g. the implantation for producing the primary maximum and, if appropriate, also for producing the second secondary maximum lying between the primary maximum and the first secondary maximum is shielded, the implantation for the first secondary maximum is also produced in the n-type inner region.

In one development of the variant, the n-type well contains at least two well dopings having mutually different maximum dopant concentrations. In the alternative, a doping corresponding to an n-type well doping having a smaller maximum dopant concentration is situated along the path. Consequently, the technical effects just mentioned also apply to the variant.

In a next development, the component contains an n-type connection region, which adjoins the n-type inner region and is doped in accordance with the n doping type and with a higher dopant concentration than the n-type inner region, for example at least one power of ten higher or at least two powers of ten higher.

In a next development, the n-type connection region is electrically conductively connected to the anode region, that is to say in particular in both current flow directions, so that an electrically conductive connection must be present outside the substrate, for example a metallic interconnect or a polycrystalline material which is silicided, by way of example.

In a next development, the n-type inner region is doped in accordance with a well doping. In this case, for the n-type inner region a well implantation is used which also serves for an n-type well for accommodating other integrated semiconductor components of the integrated circuit arrangement. The use of this well doping in the ESD protection component means that the electrical properties of the latter do not change adversely with regard to the protection effect. In many cases, it is even possible to achieve an improvement in said properties through the use of the n-type well doping present anyway, particularly if the n-type inner region is doped with a low dose on account of interruptions in the mask which are small in comparison with the well region.

In another development, the component contains a p-type connection region, which adjoins the p-type inner region and is doped in accordance with the p doping type and with a higher dopant concentration than the p-type inner region, that is to say for example higher by at least one power of ten or by at least two powers of ten.

In another development, the p-type connection region is electrically conductively connected to the cathode region, in particular outside the substrate. By way of example, both regions are connected to a ground line.

In one development, the p-type inner region is doped in accordance with a well doping with which is also doped a well which accommodates semiconductor components of the integrated circuit arrangement which do not belong to the protection circuit. In this case, too, the lower doping can be produced by interruptions in a shielding in the mask.

Through suitable interconnection of the connections of the inner regions it is possible to influence the characteristic curve of the protection component, for example with regard to the voltage dropped across the component in the case of protection or the current flowing through the component in the case of protection.

The invention additionally relates to a method for producing an integrated circuit arrangement according to the invention or one of its developments. In the production method, during the doping of the p-type well, the p-type inner region is shielded completely or with a plurality of interruptions. With regard to the alternative or cumulative variant, in the production method, during the doping of the n-type well, the n-type inner region is shielded completely or with a plurality of interruptions. This means that no additional mask has to be used. Even if, in the p-type inner region or in the n-type inner region, a partial doping is intended to be effected during the doping of the p-type well or the n-type well, no additional mask is necessary because the interruptions ensure that only some of the dopant atoms pass into the relevant region. During a subsequent thermal step, despite the interruptions, on account of the diffusion, a uniform distribution of the dopant atoms occurs at a dopant concentration which is less than the dopant concentration in the reference well.

Further objects, features and advantages of this invention will become readily apparent to persons skilled in the art after a review of the following description, with reference to the drawings and claims that are appended to and form a part of this specification.

BRIEF DESCRIPTION OF THE DRAWINGS

FIG. 3 illustrates an illustration of a transient response of the thyristor to a portion by portion linear current rise with a rise time $t_r$ equal to 1 nanosecond; and FIG. 4 illustrates three examples with variation of the p-type well doping.

DETAILED DESCRIPTION

Figure 1:
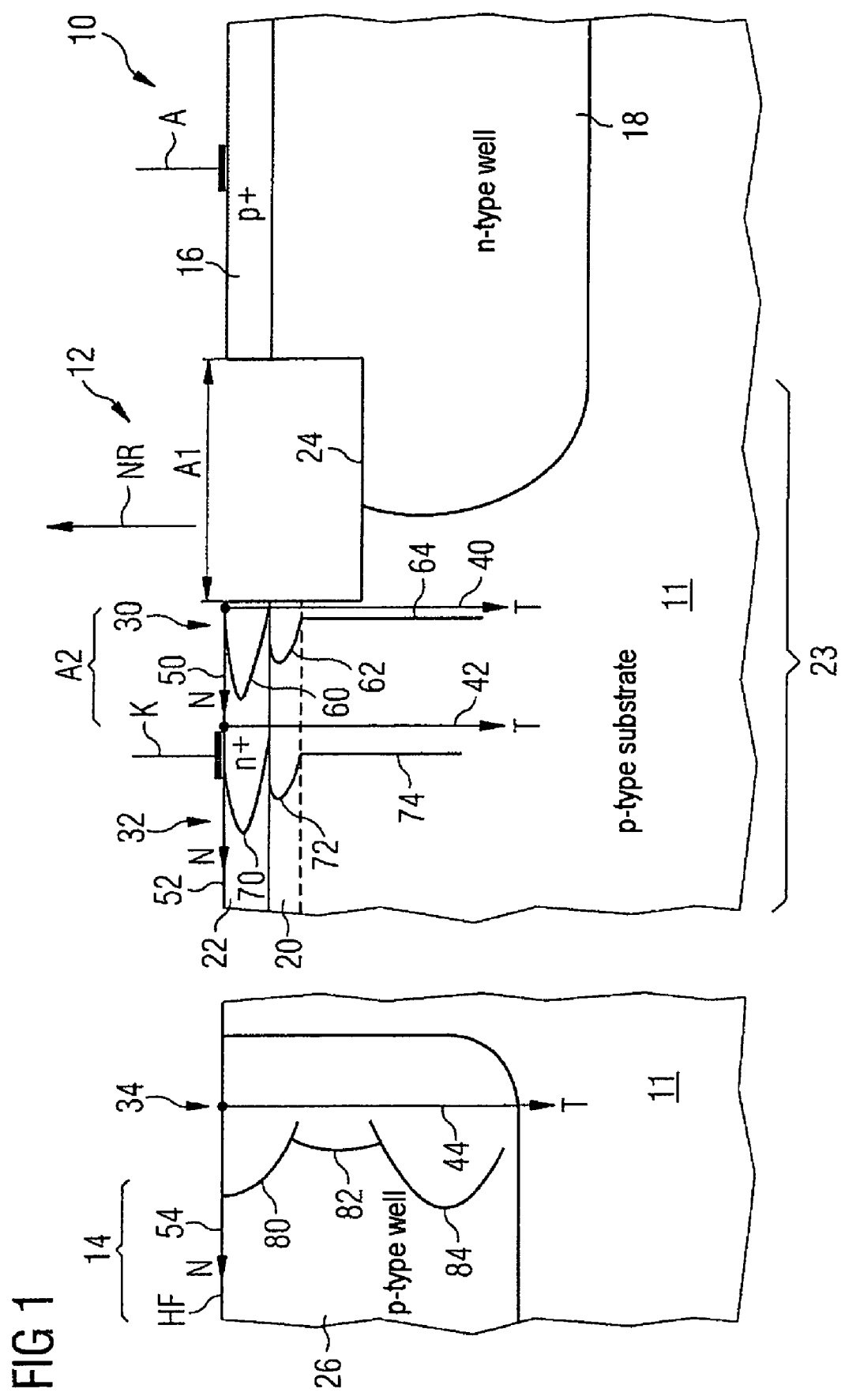
FIG. 1 illustrates a Shockley diode according to the invention.

FIG. 1 shows an integrated circuit arrangement 10 containing a substrate 11. In the exemplary embodiment, the substrate 11 is a monocrystalline silicon substrate. A Shockley diode 12 is formed in the substrate 11 of the integrated circuit arrangement 10. Moreover, the substrate 11 carries a multiplicity of integrated semiconductor components, for example a multiplicity of field-effect transistors 14, in particular n-channel field effect transistors.

The Shockley diode 12 contains an anode region 16, at which an anode connection A is connected. The anode region 16 is p-doped and doped with a dopant concentration whose maximum lies for example within the range of $10^{19}$ to $10^{21}$ dopant atoms per cubic centimeter, in particular within the range of $10^{20}$ to $10^{21}$ dopant atoms per cubic centimeter.

The anode region 16 is situated in an n-type well 18, the maximum dopant concentration of which lies for example within the range of $10^{15}$ to $10^{18}$ dopant atoms per cubic centimeter, in particular within the range of $10^{16}$ to $10^{17}$ dopant atoms per cubic centimeter. The n-type well 18 is also referred to as the n-type inner region in connection with the Shockley diode 12. At the same planar main area HF of the substrate 11 at which the anode connection A is also connected, a cathode connection K is connected to a cathode region 22. The cathode region 22 contains an n-type dopant concentration within the range of, for example, $10^{19}$ to $10^{21}$ dopant atoms per cubic centimeter, in particular within the range of $10^{20}$ to $10^{21}$ dopant atoms per cubic centimeter. A p-type inner region 23 of the Shockley diode 12 is adjacent to the cathode region 22 as the substrate depth increases. In the exemplary embodiment, the p-type inner region 23 contains, alongside a partial region of the substrate 11 with basic doping, an optional p-type region 20 having a dopant concentration lying, for example, within the range of $10^{17}$ to $10^{18}$ dopant atoms per cubic centimeter. In another exemplary embodiment, however, the p-type inner region is formed only by a partial region 23 of the p-type substrate 11, which, by way of example, only has a dopant concentration within the range of $10^{13}$ to $10^{15}$ dopant atoms per cubic centimeter, in particular within the range of $10^{14}$ to $0.5 \cdot 10^{15}$ dopant atoms per cubic centimeter.

In the exemplary embodiment illustrated in FIG. 1, there is an, in particular parallelepidal, cutout 24 between the anode region 16 and the cathode region 22. The cutout 24 serves for insulation between said regions and extending right into the n-type well 18. The cutout 24 defines a distance A1 between the anode region 16 and the cathode region 22. In the exemplary embodiment, the distance A1 is less than one micrometer. The lateral boundary of the n-type well 18 lies in a manner adjoining approximately the center of the bottom of the cutout 24.

FIG. 1 additionally illustrates, in three systems of coordinates 30, 32 and 34, dopant concentration profiles along paths which lie counter to the direction of the normal NR to the main area HF. The paths match x-axes 40, 42 and 44—lying parallel to one another—of the systems of coordinates 30, 32 and 34, respectively, the depth T with respect to the main area HF being plotted on the x-axes 40, 42 and 44. The dopant concentration N is represented on a logarithmic scale on y-axes 50, 52 and 54, respectively. The x-direction also matches the main implantation direction during the introduction of the doping of the p-type well 26 and the dopings for the Shockley diode 12.

The system of coordinates 30 shows the dopant concentration profile along a path lying at the boundary of the cathode region 22, that is to say at the distance A1 from the anode region 16.

The following curves 60, 62 and 64 are represented in the system of coordinates 30:
the curve 60 shows the n-type dopant concentration profile in the cathode region 22, that is to say an n-type dopant concentration profile whose maximum lies in the range specified above,
the curve 62 shows the p-type dopant concentration profile in the optional p-type region 20, that is to say a p-type dopant concentration profile whose maximum lies in the range specified above, and
the curve 64 shows the n-type dopant concentration profile in the substrate 11.

The system of coordinates 32 describes the dopant concentration profile along a path lying at a distance A2 from the path represented in the system of coordinates 30. By way of example, the distance A2 is 300 nanometers or, in another exemplary embodiment, 500 nanometers. The system of coordinates 32 represents three curves 70, 72 and 74, which specify the following dopant concentration profiles:
the curve 70 specifies the dopant concentration profile in the cathode region 22, that is to say an n-type dopant concentration profile whose maximum lies in the range specified above,
the curve 72 specifies the p-type dopant concentration profile in the optional p-type region 20, and
the curve 74 specifies the p-type dopant concentration profile in the p-type substrate 11.

If the p-type region 20 is absent, then the dopant concentration of the curve 64, 74 also applies to locations at which the p-type region 20 is situated in the exemplary embodiment. The curve 64, 74 is a straight line which lies parallel to the x-axis 42, and the dopant concentration of which lies in the range specified above for the p-type substrate 11.

The system of coordinates 34 shows the dopant concentration at a path which also leads through the maximum of the p-type well 26. The system of coordinates 34 represents curves 80, 82 and 84, which show the following dopant concentration profiles:
the curve 80 shows the p-type dopant profile of a surface implantation of the p-type well 26. The implantation for producing the curve profile 80 also produces the doping of the curve profile 62 or 72. The maximum of the curve 80 lies e.g. within the range of $10^{16}$ to $10^{17}$ dopant atoms per cubic centimeter.

The curve 82 shows the dopant concentration profile that was brought about by a medium-energy implantation during the production of the p-type well 82. The maximum of the curve 82 lies e.g. within the range of $10^{17}$ to $10^{18}$ dopant atoms per cubic centimeter, in particular between the maximum of the curve 80 and the maximum of the curve 84.

The curve 84 shows the dopant concentration profile which was produced during a high-energy implantation during the production of the p-type well. The maximum of the curve 84 lies for example within the range of $0.5\ 10^{18}$ to $0.5\ 10^{19}$ dopant atoms per cubic centimeter. Said maximum is the primary maximum in the p-type well 26.

The curve 80 contains a first secondary maximum and the curve 82 contains a second secondary maximum in the p-type well 26. A local minimum lies between the first secondary maximum and the second secondary maximum. In addition, there is a local minimum between the second secondary maximum and the primary maximum 84.

As will be explained in greater detail below with reference to FIG. 4, during the production of the middle implantation and the deep implantation of the p-type well 26, the p-type inner region is covered, so that in this region there are no dopant concentration profiles corresponding to the dopant concentration profile 82 or 84.

In another exemplary embodiment, however, in the p-type inner region 23 there is also a dopant concentration profile which also corresponds to the middle dopant concentration profile 82. However, in this case, too, there is no dopant concentration profile corresponding to the deep dopant concentration profile 84 of the p-type well 26.

Figure 2:
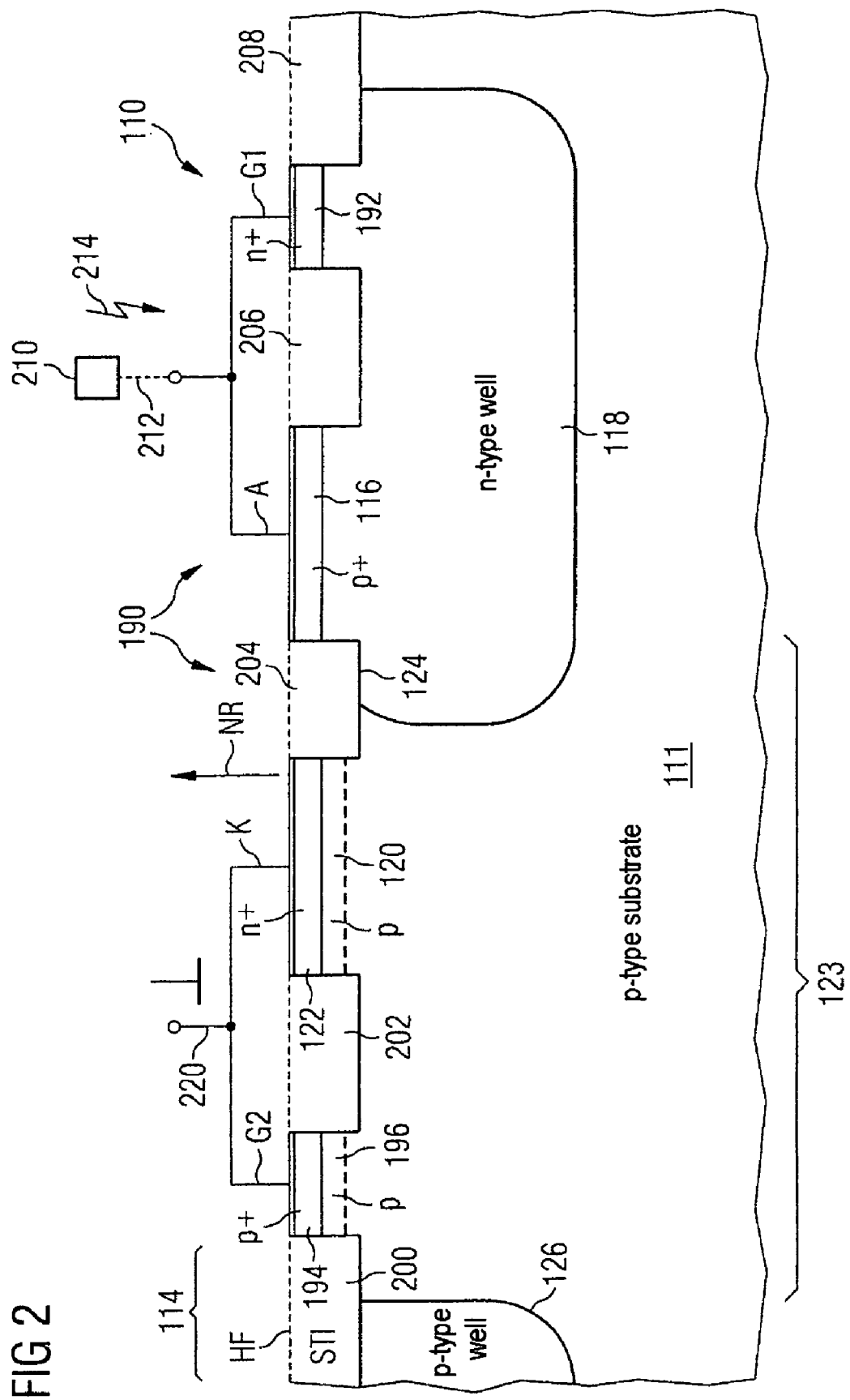
FIG. 2 illustrates a thyristor according to the invention.

FIG. 2 shows a thyristor 190 according to the invention, which contains regions of a Shockley diode, so that the constituent parts thereof need not be explained again. However, in order to differentiate between the Shockley diode and the thyristor, reference symbols for designating elements having the same function and the same construction are in each case preceded by 1, see for example anode region 116 in comparison with the anode region 16, or cathode region 122 in comparison with the cathode region 22.

The thyristor 190 contains a connection region 192, which has an n-type dopant concentration within the range of $10^{19}$ to $10^{21}$ dopant atoms per cubic centimeter, in particular $10^{20}$ to $10^{21}$ dopant atoms per cubic centimeter, and which adjoins the n-type well 118 or serves for the connection thereof. The connection region 192 is adjoined toward the top by a control connection G1, which contains e.g. metal or polycrystalline silicon.

The thyristor 190 additionally contains a connection region 194, which is p-doped, for example within the range of $10^{19}$ to $10^{21}$ dopant atoms per cubic centimeter, in particular $10^{20}$ to $10^{21}$ dopant atoms per cubic centimeter. Both connection regions 192 and 194 are situated at the main area HF of the p-type substrate 111. The connection region 194 is connected with the aid of a control connection G2 adjoining it.

Below the connection region 194 there is an optional p-type region 196 having the same dopant concentration as the p-type region 120 or the p-type region 20.

The dopant concentration profiles explained with reference to FIG. 1 in the systems of coordinates 30, 32 and 34 also apply to the circuit arrangement 110.

There are situated at the surface of the substrate 111 STI trenches (shallow trench insulation) 200, 202, 204, 206 and 208, which lie in the following order:

between the p-type well 126 and the connection region 194,
between the connection region 194 and the cathode region 122,
between the cathode region 122 and the anode region 116,
between the anode region 116 and the connection region 192, and
between the connection region 192 and the substrate 111.

Instead of STI trenches, in another exemplary embodiment, use is made of selective epitaxy for producing projections in which the connection region 194, the cathode region 192, the anode region 116 and the connection region 192 are situated. Afterward, the cutouts between said projections can also be filled with an insulating material. However, mesa structures are also used as an alternative. In another alternative, the surface of the substrate 11 or 110 is planar. The insulation is obtained by means of sufficient distances between the regions 194, 122, 116 and 192.

FIG. 2 additionally schematically illustrates a connection pad 210 of the integrated circuit arrangement, at which connection pad an external connection of the integrated circuit arrangement 110 can be connected. A connection interconnect 212 leads from the connection pad 210 to the anode connection A and to the control connection G1. The connection interconnect 212 contains, for example, a section made from a copper alloy comprising more than 90 atomic percent of copper or made from an aluminum alloy comprising more than 90 atomic percent of aluminum. In an ESD case, a voltage pulse having a large amplitude is impressed at the connection pad 210, see lightning 214. By way of example, the connection pad 210 is a connection pad for the connection of the positive operating potential line. In another alternative, the connection pad 210 is an input signal connection pad. In a further alternative, the connection pad 210 is an output signal connection pad. Connection pads for bidirectional signals are also protected in the same way.

In the exemplary embodiment, there is ground line 220 connected to the cathode connection K and to the control electrode G2, which makes contact with the connection region 194. The ground interconnect 220 carries ground potential.

It holds true regarding the function of the thyristor 190 that the turn-on time of the thyristor 190 is significantly dependent, inter alia, on the doping of the inner regions and on internal distances. In the present exemplary embodiment, an acceleration of the turn-on properties of the thyristor is obtained primarily by the variation of the p-type inner region doping. The thyristor 190 has no p-type well doping in the region of the thyristor 190. The comparatively low p-type doping around the n-type well 118 has the effect:

of increasing the gain factor of the inherent npn transistor, the base of which is the p-type inner region 123. Consequently, a lower current suffices to switch on one transistor of the thyristor 190. If the n-type well 118 is also doped more lightly than a reference well with transistors in the circuit arrangement 110, then the second transistor of the thyristor 190 also switches on more rapidly.

That the junction capacitance between the p-type inner region and the n-type inner region is reduced because the dopant concentration is comparatively low. The lower capacitance ensures that the thyristor can be switched on rapidly, charge-reversal operations take place more rapidly because a charge carrier flooding of the p-type inner region and of the n-type inner region can be achieved more rapidly, so that the thyristor also switches more rapidly for this reason.

The thyristor 190 illustrated only represents a limiting case. By skillful layout design it is also possible, of course, to produce p-type inner region dopings which lie quantitatively between that of the p-type well 26 and that of the p-type inner region 123 illustrated. Furthermore, the distance between the n-type well and the n+ diffusion connected to ground decreases as a result of diffusion processes during processing. Said distance can be altered and additionally optimized by simple layout variation. Both the reduction of the p-type inner region doping and the reduction of said distance between n-type well 18 and n+ diffusion 22 leads to a shortening of the turn-on time of the thyristor. Similar considerations also apply to the Shockley diode in accordance with FIG. 1.

FIG. 3 shows a simulated transient response (U(t) characteristic curve) of the thyristor 190 to a portion by portion linear current rise with a rise time $t_r$ equal to 1 ns (nanosecond), see curve 262. FIG. 3 shows a system of coordinates 250, on the x-axis 252 of which the time t is plotted in the range of from $10^{-12}$ second to $10^{-6}$ second. The voltage U in volts in the range of from 0 volts to 18 volts is plotted on the y-axis 254 of the system of coordinates 250. The curves 260 and 262 were recorded using a current of 250 milliamperes rising from 0 milliamperes to 250 milliamperes within $10^{-9}$ second, see dashed line 266 at the instant of the end of the current rise. The curve 260 applies to a comparative thyristor having the same dopant concentration as the p-type well 126 in the p-type inner region.

The device simulation of the comparative thyristor and of the thyristor 190 without a p-type well shows the optimization potential. The thyristor 190 in accordance with the exemplary embodiment of the invention clamps the voltage after the end of the current rise within one nanosecond virtually to the static holding voltage U1, which here is approximately 1.5 volts. After e.g. approximately half a nanosecond after the end of the current rise, the thyristor according to the invention reaches a noncritical value of e.g. 3.5 volts, see dashed line 268. By contrast, the comparative thyristor needs at least two orders of magnitude longer to reduce the voltage drop to the same value, see line 270. On account of the time delay until reaching the 3.5 volts, in the case of the comparative thyristor this voltage is no longer noncritical, however, because dielectrics can be damaged during the prolonged time duration. Moreover, the comparative thyristor does not attain the static holding voltage even during the entire simulation time of approximately one microsecond.

Apart from the acceleration of the turn-on properties of the thyristor 190, there are the following technical effects:

the variation of the p-type inner region doping is neutral in respect of area, that is to say that it is also neutral in respect of costs. By saving trigger elements, the effectively required area can even be reduced.

The capacitance of the protection structure is not increased by trigger elements, the complexity of the circuit and thus the risk of faulty designs is reduced.

No additional masks are necessary, such as e.g. for adapting the breakdown voltage in ggMOSFET solutions (irrespective of use as a protection element or as a trigger or control element).

The concept presented may, of course, also be applied in an analogous manner in complementary technologies. Thus, the n-type well may be varied e.g. in an n-type substrate technology. Moreover, in further exemplary embodiments, the dopings of the n-type well 118 and a corresponding p-type well of the p-type inner region are doped more lightly than reference wells of the same integrated circuit arrangement.

FIG. 4 shows three examples of variants of the p-type well doping in the region of a thyristor 390, which is similar to the thyristor 190 in terms of its construction and its function apart from the differences explained below. For this reason, the constituent parts of the thyristor 390 will not be explained again. For differentiation, however, the value "200" has been added to the constituent parts of the thyristor 390 in comparison with the thyristor 190, see for example integrated circuit arrangement 310 in comparison with the circuit arrangement 110 or anode region 316 in comparison with the anode region 116.

The exemplary embodiments are illustrated as a two-dimensional section in FIG. 4. Example A illustrates the comparative thyristor. In this case, the mask PW, which defines the p-type well 26, is the inverse of or complementary to the mask NW, which defines the n-type well 318. Consequently, regions left free by the mask NW are covered by the mask PW. Regions covered by the mask NW are left free by the mask PW.

The masks for the production of the thyristor 390 are shown in example B. The mask NW for the n-type well 318 remains unchanged. The mask PW, however, is extended to the entire length (in three dimensions: to the entire area) of the thyristor 390.

Example C shows, by way of example, the masks for the production of a thyristor having a p-type inner region doping which lies between those of examples A and B. This is achieved in the two-dimensional representation by the regular interruption of the mask PW in the region of the p-type inner region. A photoresist, or a hard mask, generated and patterned in this way partially blocks the doping. In principle, that proportion of the mask PW which is transparent decides the doping of the p-type inner region or of the p-type well. This can readily be generalized to three dimensions by virtue of the higher diversity of possibilities for the interruptions.

The actual form of the n-type well varies as a result of diffusion processes during processing. The optimization of a distance d between n+ diffusion 322 and n-type well 318 can be achieved by simple adaptation of the layout.

The masks shown in FIG. 4 are used together with positive resist, in the case of which only unexposed regions of a resist remain after development on the circuit arrangement. When using negative resists, however, masks which are the inverse of or complementary to the masks shown are used. The coverings of regions as illustrated in FIG. 4 can thus be achieved both using positive resist and using negative resist.

The Shockley diode 190 illustrated in FIG. 1 can also be produced by means of the masks in accordance with example B or example C, but the connection regions 392 and 394 are not present.

FIG. 4 additionally illustrates the distance d corresponding to the distance between the boundary of the n-type well 318 and the edge of the cathode region 322. The distance d should be as small as possible without short circuits occurring between the n-type well 318 and the cathode region 322. In particular, the distance d is less than 300 nanometers.

To summarize, it holds true that an optimization of a Shockley diode or of a thyristor using CMOS (Complementary Metal Oxide Semiconductor) p-type substrate technology has been specified particularly with regard to its properties as ESD protection elements, in particular its turn-on time. This is achieved by variation of the p-type well doping without additional masks. The concept can also be applied analogously to other components (e.g. bipolar transistors). In the case of the Shockley diode or in the case of the thyristor, a further optimization can be achieved by subsequently readjusting the distance d between cathode (n+ diffusion) and the n-type well.

With regard to the order of producing wells and diffusions for anode, cathode and inner regions, it holds true that, by way of example, firstly the wells and then the other diffusions are produced. As an alternative, firstly the other diffusions and then the wells are produced. A multiple changeover is also possible, that is to say e.g. first n-type wells, then diffusions and only then the p-type wells.

As a person skilled in the art will readily appreciate, the above description is meant as an illustration of implementation of the principles of this invention. This description is not intended to limit the scope or application of this invention in that the invention is susceptible to modification, variation and change, without departing from the spirit of this invention, as defined in the following claims.

The invention claimed is:

1. An integrated circuit arrangement comprising:
   an anode region located in a substrate, the anode region doped in accordance with a p doping type;
   a cathode region located in the substrate, the cathode region spaced apart from the anode region and doped in accordance with an n doping type in the substrate;
   an n-type inner region doped in accordance with the n doping type and with a lower dopant concentration in comparison with the anode region, said n-type inner region adjoining the anode region in the substrate;
   a p-type inner region doped in accordance with the p doping type and with a lower dopant concentration in comparison with the cathode region, said p-type inner region adjoining the cathode region and the n-type inner region in the substrate;
   a p-type well containing a maximum dopant concentration along a first path running counter to the direction of the normal to a surface of the substrate and through or at the cathode region down to a depth at which the maximum dopant concentration of the p-type well is situated, the maximum dopant concentration of the p-type inner region remains below the maximum p-type dopant concentration of the p-type well; and/or
   in an n-type well containing a maximum n-type dopant concentration, along a second path running counter to the direction of the normal to the surface of the substrate and through or at the anode region down to a depth at which the maximum dopant concentration of the n-type well is situated, the maximum dopant concentration of the n-type inner region remains below the maximum n-type dopant concentration of the n-type well.

2. The integrated circuit arrangement as claimed in claim 1, wherein the anode region, the cathode region, the n-type inner region and the p-type inner region are constituent parts of an electrostatic discharge protection element of the integrated circuit arrangement.

3. The integrated circuit arrangement as claimed in claim 2, wherein the first path runs at a side of the cathode region that faces the anode region, or wherein the second path runs at a side of the anode region that faces the cathode region.

4. The circuit arrangement as claimed in claim 1, wherein the first path runs at a side of the cathode region that faces the anode region, or wherein the second path runs at a side of the anode region that faces the cathode region.

5. The circuit arrangement as claimed in claim 1, wherein: the maximum dopant concentration of the p-type inner region remains at least one power of ten below the maximum p-type dopant concentration of the p-type well or the maximum dopant concentration of the n-type inner region remains at least one power of ten below the maximum n-type dopant concentration of the n-type well.

6. The circuit arrangement as claimed in claim 1, wherein the first path at a first reference depth, which is equal to the depth of the location having a maximum dopant concentration in the p-type well, a dopant concentration which is at least one power of ten below the maximum p-type dopant concentration of the p-type well; or the second path at a second reference depth, which is equal to the depth of the location having the maximum dopant concentration in the n-type well from the main area, a dopant concentration which is at least one power of ten below the maximum n-type dopant concentration of the p-type well.

7. The circuit arrangement as claimed in claim 6, wherein a basic dopant concentration of the substrate is present at the first reference depth.

8. The circuit arrangement as claimed in claim 1, wherein the p-type well contains at least two well dopings having mutually different maximum dopant concentrations, and wherein, a doping corresponding to the well doping having a smaller maximum dopant concentration is also situated along the first path; or the n-type well contains at least two well dopings having mutually different maximum dopant concentrations, and wherein a doping corresponding to the n-type well doping having a smaller maximum dopant concentration is situated along the second path.

9. The circuit arrangement as claimed in claim 1, comprising an n-type connection region, which adjoins the n-type inner region and is n-type doped with a higher dopant concentration than the n-type inner region.

10. The circuit arrangement as claimed in claim 9, wherein the n-type connection region is electrically conductively connected to the anode region.

11. The circuit arrangement as claimed in claim 1, wherein the n-type inner region is doped in accordance with a well doping or the p-type inner region is doped in accordance with a well doping.

12. The circuit arrangement as claimed in claim 1, comprising a p-type connection region, which adjoins the p-type inner region and is p-type doped with a higher dopant concentration than the p-type inner region.

13. The circuit arrangement as claimed in claim 12, wherein the p-type connection region is electrically conductively connected to the cathode region.

14. The circuit arrangement as claimed in claim 1, wherein the p-type inner region is doped in accordance with a well doping or the n-type inner region is doped in accordance with a well doping.

* * * * *

UNITED STATES PATENT AND TRADEMARK OFFICE
CERTIFICATE OF CORRECTION

| | | |
|---|---|---|
| PATENT NO. | : 7,679,103 B2 | Page 1 of 1 |
| APPLICATION NO. | : 11/604519 | |
| DATED | : March 16, 2010 | |
| INVENTOR(S) | : Ulrich Glaser et al. | |

It is certified that error appears in the above-identified patent and that said Letters Patent is hereby corrected as shown below:

On the Title Page

Item (75), replace "Neurled" with --Neuried--.

Signed and Sealed this

Fourth Day of January, 2011

David J. Kappos
*Director of the United States Patent and Trademark Office*